United States Patent
Ulm

(10) Patent No.: US 11,226,360 B2
(45) Date of Patent: Jan. 18, 2022

(54) OVER-THE-AIR TEST SYSTEM AND METHOD WITH VISUAL STATUS INDICATION

(71) Applicant: Rohde & Schwarz GmbH & Co. KG, Munich (DE)

(72) Inventor: Andreas Ulm, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 290 days.

(21) Appl. No.: 15/988,767

(22) Filed: May 24, 2018

(65) Prior Publication Data

US 2019/0361063 A1    Nov. 28, 2019

(51) Int. Cl.
| | |
|---|---|
| *H04B 17/00* | (2015.01) |
| *G01R 29/10* | (2006.01) |
| *H04B 17/21* | (2015.01) |
| *H04B 17/29* | (2015.01) |

(52) U.S. Cl.
CPC ....... *G01R 29/105* (2013.01); *H04B 17/0085* (2013.01); *H04B 17/21* (2015.01); *H04B 17/29* (2015.01)

(58) Field of Classification Search
CPC .. H01Q 3/267; G01R 29/105; G01R 29/0821; G01R 29/0878; G01R 31/2822; H04B 17/0085; H04B 17/29; H04B 17/21; H04B 17/30; H04B 17/16
See application file for complete search history.

(56) References Cited

U.S. PATENT DOCUMENTS

| | | | |
|---|---|---|---|
| 5,134,405 A | 7/1992 | Ishihara et al. | |
| 7,286,961 B2 * | 10/2007 | Kildal ................ | G01R 29/0821 702/182 |
| 8,954,014 B2 * | 2/2015 | Kyosti ............... | G01R 29/0814 370/310 |
| 2007/0254643 A1 * | 11/2007 | Garcia .................. | H04L 1/1867 455/423 |
| 2014/0141727 A1 * | 5/2014 | Kildal .................... | H04B 17/15 455/67.12 |
| 2015/0042287 A1 * | 2/2015 | Liu ........................ | G06F 1/3215 320/134 |
| 2016/0359573 A1 * | 12/2016 | Pauly ..................... | H04B 17/21 |
| 2019/0331719 A1 * | 10/2019 | Cummings ........ | G01R 31/2822 |
| 2019/0356397 A1 * | 11/2019 | DaSilva ................ | H04B 17/17 |
| 2019/0391195 A1 * | 12/2019 | Kvarnstrand .......... | H04B 17/29 |

* cited by examiner

*Primary Examiner* — Dameon E Levi
*Assistant Examiner* — David E Lotter
(74) *Attorney, Agent, or Firm* — Ditthavong, Steiner & Mlotkowski

(57) ABSTRACT

An over-the-air test system is provided. The over-the-air test system comprises a test chamber, a device under test, measurement equipment for performing at least one wireless measurement with respect to the device under test, and a signaling unit. In this context, the signaling unit is configured to visually and/or acoustically indicate a status of the at least one wireless measurement.

15 Claims, 5 Drawing Sheets

OVER-THE-AIR TEST SYSTEM AND METHOD WITH VISUAL STATUS INDICATION

TECHNICAL FIELD

The invention relates to an over-the-air test system and an over-the-air test method with visual status indication.

BACKGROUND ART

Generally, in times of an increasing number of applications providing wireless connectivity capabilities, there is a growing need of an over-the-air test system and an over-the-air test method for performing wireless measurements within a test chamber especially in order to verify proper functioning of said applications in an efficient manner, whereby measurement efficiency is preferably ensured with the aid of visual status indication.

U.S. Pat. No. 5,134,405 discloses an electromagnetically anechoic chamber for EMC (Electromagnetic Compatibility) tests of electronic devices. The floor, ceiling and side wall of the anechoic chamber have panels of electromagnetic wave absorber having many ferrite tiles, and shield members comprising double layered shield members of copper sheets and iron sheets for absorbing and reflecting the foreign electromagnetic wave. As it can be seen, due to the fact that said anechoic chamber does not provide any visual status indication, measurements cannot be performed in a highly efficient manner.

Accordingly, there is a need to provide an over-the-air test system and an over-the-air test method with visual status indication, whereby high measurement efficiency is especially ensured.

SUMMARY OF THE INVENTION

According to a first aspect of the invention, an over-the-air test system is provided. The over-the-air test system comprises a test chamber, a device under test, measurement equipment for performing at least one wireless measurement with respect to the device under test, and a signaling unit. In this context, the signaling unit is configured to visually and/or acoustically indicate a status of the at least one wireless measurement. Advantageously, a high measurement efficiency can be ensured.

According to a first preferred implementation form of the first aspect of the invention, the device under test comprises at least one antenna under test. Advantageously, the device under test provides wireless connectivity.

According to a further preferred implementation form of the first aspect of the invention, the measurement equipment comprises at least one signal generating unit. Advantageously, test signals can be generated.

According to a further preferred implementation form of the first aspect of the invention, the at least one signal generating unit comprises at least one measurement antenna, preferably a measurement antenna array. Advantageously, test signals can be transmitted wirelessly. Further advantageously, in the case of at least two antennas or an antenna array, respectively, measurements can be performed for investigating especially a beamforming behavior.

According to a further preferred implementation form of the first aspect of the invention, the signaling unit is further configured to indicate the status of the at least one measurement in an audio and/or visual manner. Advantageously, measurement efficiency can further be increased.

According to a further preferred implementation form of the first aspect of the invention, the signaling unit is further configured to display different sensitivity ranges with respect to the at least one wireless measurement. Advantageously, measurements can be performed in an accurate manner.

According to a further preferred implementation form of the first aspect of the invention, the signaling unit is further configured to display a first color, preferably yellow, for the purpose of signaling that the measurement is running. Advantageously, a first operating condition or status, respectively, can efficiently be visualized.

According to a further preferred implementation form of the first aspect of the invention, the signaling unit is further configured to display a second color, preferably red, for the purpose of measuring high power with at least one attenuator. Advantageously, a second operating condition can efficiently be visualized.

According to a further preferred implementation form of the first aspect of the invention, the signaling unit is further configured to display a third color, preferably blue, for the purpose of measuring especially low power without an attenuator. Advantageously, a third operating condition can efficiently be visualized.

According to a further preferred implementation form of the first aspect of the invention, the signaling unit is further configured to display a fourth color, preferably green, for the purpose of measuring with at least one amplifier. Advantageously, a fourth operating condition can efficiently be visualized.

According to a further preferred implementation form of the first aspect of the invention, the signaling unit is located in the test chamber. Additionally or alternatively, the test chamber is an anechoic camber. Advantageously, an indirect lighting within the chamber with the aid of the signaling unit allows for an efficient status indication with respect to the measurement.

According to a further preferred implementation form of the first aspect of the invention, the signaling unit comprises a light bulb with different colors. As an alternative, the signaling unit comprises a LED light strip with different colors. Advantageously, different operating conditions can be visualized with the aid of the same signaling unit.

According to a further preferred implementation form of the first aspect of the invention, the measurement equipment comprises at least one of an oscilloscope, a network analyzer, a receiver, a scanner, a spectrum analyzer, a plane wave converter, or any combination thereof. Advantageously, the inventive over-the-air test system can be used with any type of measurement device.

According to a further preferred implementation form of the first aspect of the invention, the signaling unit is attached to the measurement equipment, preferably a housing of the measurement equipment, more preferably a side wall of the housing of the measurement equipment. Advantageously, the measurement equipment is indirectly illuminated, whereby the status of the measurement is efficiently visualized.

According to a further preferred implementation form of the first aspect of the invention, the signaling unit is attached to the at least one signal generating unit, preferably a housing of the at least one signal generating unit, more preferably a side wall of the housing of the at least one signal generating unit. Advantageously, the signal generating unit is indirectly illuminated, whereby the status of the measurement is efficiently visualized.

According to a further preferred implementation form of the first aspect of the invention, the signaling unit is attached to the at least one measurement antenna, especially the measurement antenna array, preferably a housing of the at least one measurement antenna, especially a housing of the measurement antenna array, more preferably a side wall of the housing of the at least one measurement antenna, especially a side wall of the housing of the measurement antenna array. Advantageously, the measurement antenna or the measurement antenna array, respectively, is indirectly illuminated, whereby the status of the measurement is efficiently visualized.

According to a second aspect of the invention, an over-the-air test method is provided. The over-the-air test method comprises the steps of performing at least one wireless measurement with respect to a device under test with the aid of measurement equipment within a test chamber, and visually and/or acoustically indicating a status of the at least one wireless measurement with the aid of a signaling unit. Advantageously, a high measurement efficiency can be ensured.

According to a first preferred implementation form of the second aspect of the invention, the over-the-air test method further comprises the step of attaching the signaling unit to the measurement equipment, preferably a housing of the measurement equipment, more preferably a side wall of the housing of the measurement equipment. Advantageously, the measurement equipment is indirectly illuminated, whereby the status of the measurement is efficiently visualized.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
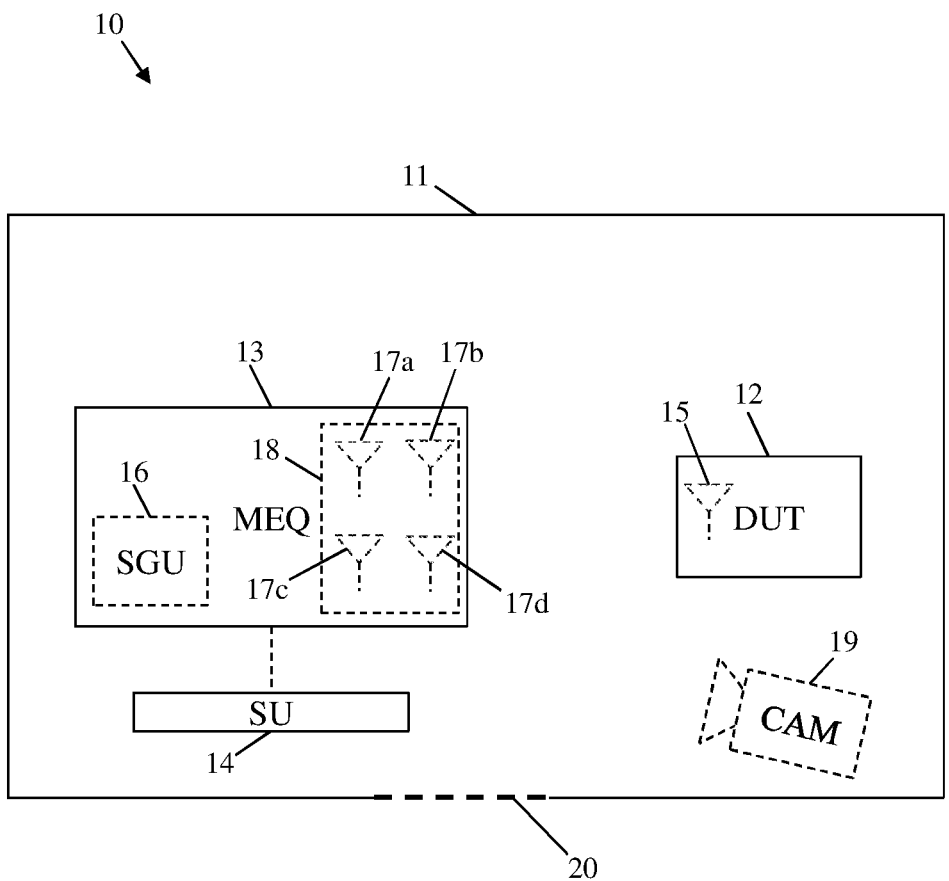
FIG. 1 shows an exemplary embodiment of the first aspect of the invention.

Firstly, FIG. 1 illustrates an exemplary embodiment of an inventive over-the-air test system 10 with visual status indication. The over-the-air test system 10 comprises a test chamber 11, a device under test 12, measurement equipment 13 for performing at least one wireless measurement with respect to the device under test 12, and a signaling unit 14. In this context, the signaling unit 14 is configured to visually and/or acoustically indicate a status of the at least one wireless measurement.

As it can further be seen from FIG. 1, the device under test 12 may optionally—as illustrated with the aid of the dotted line—comprise at least one antenna under test, exemplarily the antenna under test 15.

In addition to this, the measurement equipment 13 may optionally comprise at least one signal generating unit, exemplarily the signal generating unit 16.

In this context, the at least one signal generating unit, especially the signal generating unit 16, may optionally comprise at least one measurement antenna, exemplarily the four measurement antennas 17a, 17b, 17c, 17d, which preferably form a measurement antenna array 18.

Furthermore, it is noted that the signaling unit 14 may further be configured to indicate the status of the at least one wireless measurement in an audio and/or visual manner.

In addition to this or as an alternative, the signaling unit 14 may further be configured to display different sensitivity ranges with respect to the at least one wireless measurement.

It might be particularly advantageous if the signaling unit 14 is further configured to display a first color, preferably yellow, for the purpose of signaling that the measurement is running. Further advantageously, the signaling unit 14 may further be configured to display a second color, preferably red, for the purpose of measuring high power with at least one attenuator. In addition to this, it should be mentioned that the signaling unit 14 may further be configured to display a third color, preferably blue, for the purpose of measuring especially low power without an attenuator. Moreover, the signaling unit 14 may further be configured to display a fourth color, preferably green, for the purpose of measuring with at least one amplifier.

As illustrated with the aid of FIG. 1, the signaling unit 14 is preferably located in the test chamber 11. Additionally or alternatively, the test chamber 11 may preferably be an anechoic camber.

With respect to the signaling unit 14, it is noted that the signaling unit 14 may comprise or may be a light bulb with different colors. As an alternative, the signaling unit 14 may comprise or may be a LED light strip with different colors.

With respect to the measurement equipment 13, it should be mentioned that the measurement equipment 13 may comprise at least one of an oscilloscope, a network analyzer, a receiver, a scanner, a spectrum analyzer, a plane wave converter, or any combination thereof.

Furthermore, the test chamber 11 may optionally comprise a camera 19 for observing the measurement within the test chamber 11. In this context, the signaling unit 14 may especially be configured to illuminate, preferably to indirectly illuminate, the major parts of the respective measurement setup. Said major parts may especially comprise at least one of the measurement equipment 13, the signal generating unit 16, at least one of the measurement antennas 17a, 17b, 17c, 17d, the measurement antenna array 18, or any combination thereof. Additionally or alternatively, at least one of the device under test 12 or the antenna under test 15 may also be illuminated.

In addition to the camera 19 or as an alternative, it is noted that the test chamber 11 may optionally comprise a window 20, for viewing the test setup from outside the test chamber 11.

Figure 2:
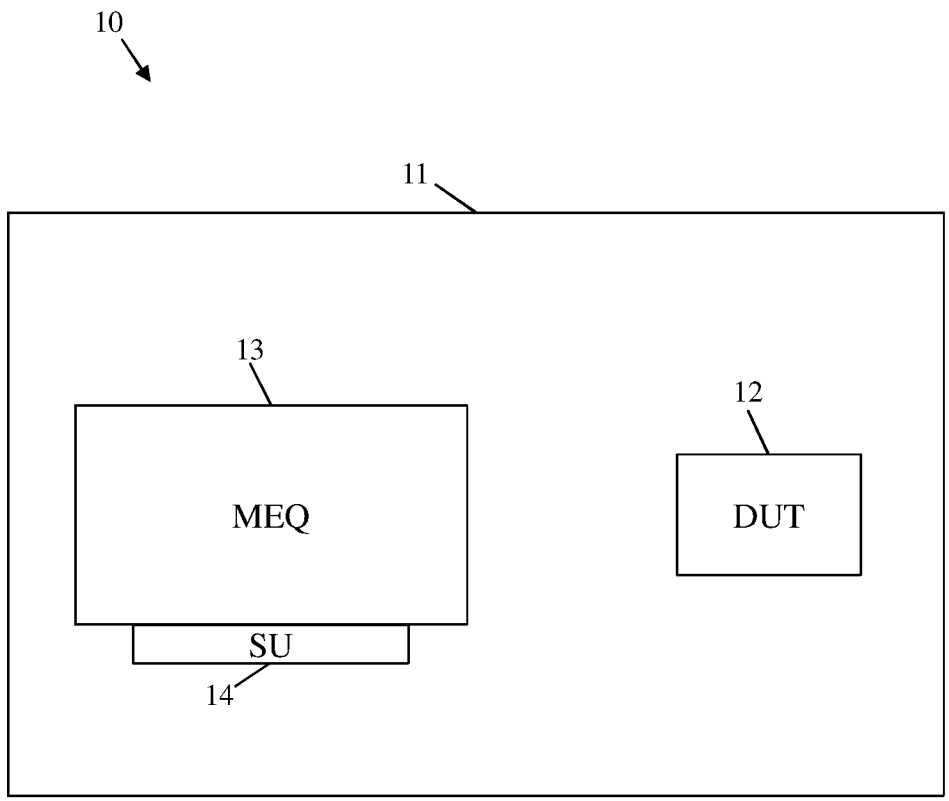
FIG. 2 shows a further exemplary embodiment of the first aspect of the invention.
Figure 3:
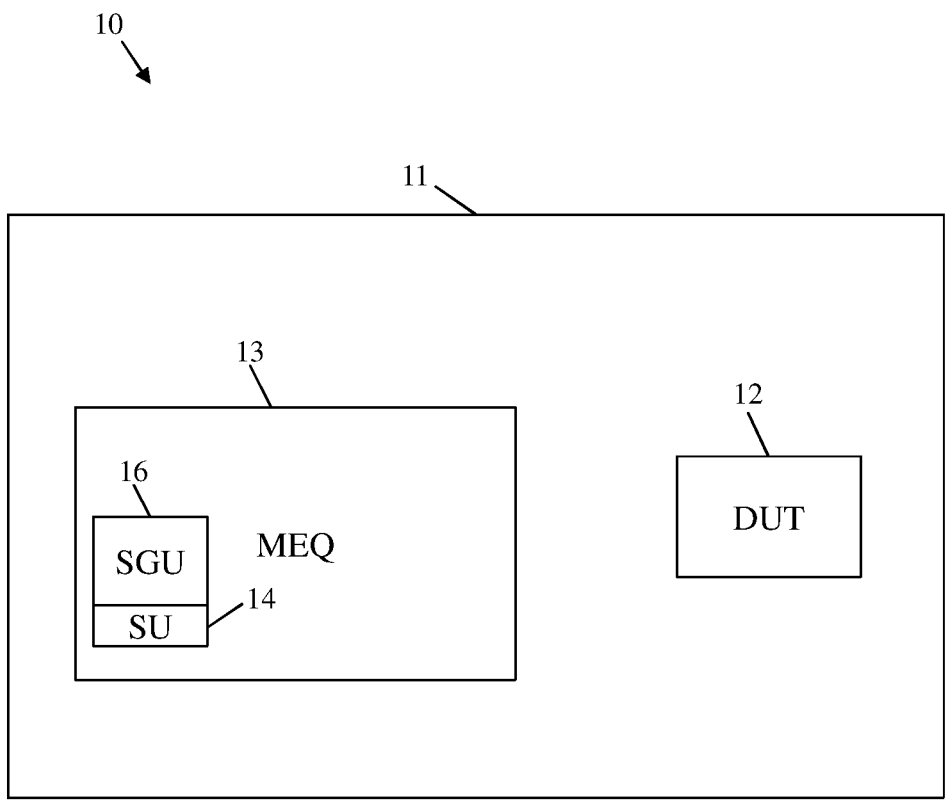
FIG. 3 shows a further exemplary embodiment of the first aspect of the invention.
Figure 4:
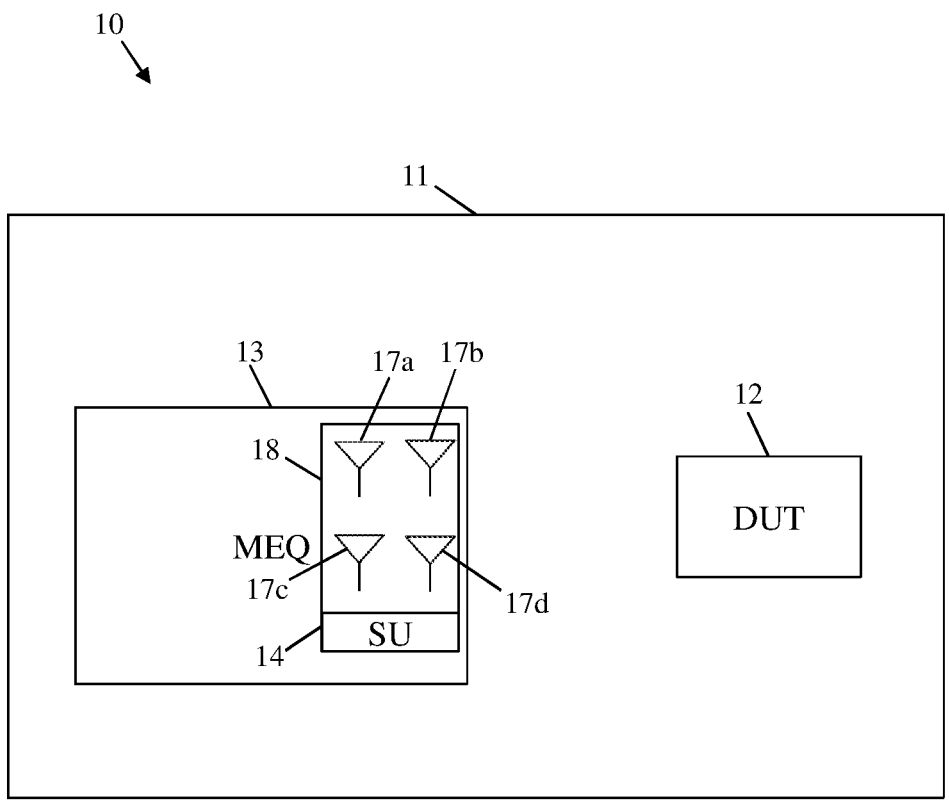
FIG. 4 shows a further exemplary embodiment of the first aspect of the invention.

At this point, it should be mentioned that the optional components of FIG. 1 described above may also be part of each of the following exemplary embodiments according to FIG. 2, FIG. 3, and FIG. 4, even though the respective components are not explicitly depicted in said figures.

Now, with respect to FIG. 2, a further exemplary embodiment of the inventive test system 10 is depicted. As it can be seen, in this exemplary case, the signaling unit 14 is attached to the measurement equipment 13, preferably a housing of the measurement equipment 13, more preferably a side wall of the housing of the measurement equipment 13.

According to FIG. 3, a further exemplary embodiment of the inventive test system 10 is shown, wherein the signaling unit 14 is attached to the signal generating unit 16, preferably a housing of the signal generating unit 16, more preferably a side wall of the housing of the signal generating unit 16.

Furthermore, FIG. 4 illustrates a further exemplary embodiment of the inventive test system 10. In this exemplary case, the signaling unit 14 is attached to the measurement antenna array 18, preferably a housing of the measurement antenna array 18, more preferably a side wall of the housing of the measurement antenna array 18.

As an alternative, it is noted that the signaling unit 14 may be attached to at least one of the measurement antennas 17*a*, 17*b*, 17*c*, 17*d*, preferably a housing of the at least one of the measurement antennas 17*a*, 17*b*, 17*c*, 17*d*, more preferably a side wall of the housing of the at least one of the measurement antennas 17*a*, 17*b*, 17*c*, 17*d*.

Figure 5:
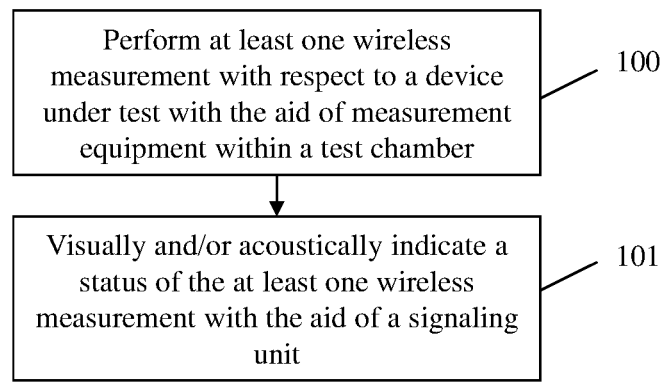
FIG. 5 shows a flow chart of an exemplary embodiment of the second aspect of the invention.

Finally, FIG. 5 shows a flow chart of an exemplary embodiment of the inventive test method with visual status indication. In a first step 100, at least one wireless measurement is performed with respect to a device under test with the aid of measurement equipment within a test chamber. Then, in a second step 101, a status of the at least one wireless measurement is visually and/or acoustically indicated with the aid of a signaling unit.

In addition to this, the over-the-air test method may further comprise the step of attaching the signaling unit to the measurement equipment, preferably a housing of the measurement equipment, more preferably a side wall of the housing of the measurement equipment.

Furthermore, it is noted that the device under test may comprise at least one antenna under test. Additionally, the measurement equipment may comprise at least one signal generating unit. It might be particularly advantageous if the at least one signal generating unit comprises at least one measurement antenna, preferably a measurement antenna array.

Further advantageously, the signaling unit may further be configured to indicate the status of the at least one measurement in an audio and/or visual manner.

Moreover, the signaling unit may further be configured to display different sensitivity ranges with respect to the at least one wireless measurement.

It is noted that it might be particularly advantageous if the signaling unit is further configured to display a first color, preferably yellow, for the purpose of signaling that the measurement is running.

In addition to this, the signaling unit may further be configured to display a second color, preferably red, for the purpose of measuring high power with at least one attenuator.

In further addition to this, the signaling unit may further be configured to display a third color, preferably blue, for the purpose of measuring especially low power without an attenuator.

Moreover, the signaling unit may further be configured to display a fourth color, preferably green, for the purpose of measuring with at least one amplifier.

Furthermore, it is noted that the signaling unit may be located in the test chamber. Additionally or alternatively, the test chamber may be an anechoic camber.

It might be particularly advantageous if the signaling unit comprises a light bulb with different colors. As an alternative, the signaling unit may comprise a LED light strip with different colors.

Additionally, with respect to the measurement equipment, it should be mentioned that the measurement equipment may comprise at least one of an oscilloscope, a network analyzer, a receiver, a scanner, a spectrum analyzer, a plane wave converter, or any combination thereof.

Moreover, it might be particularly advantageous if the signaling unit is attached to the at least one signal generating unit, preferably a housing of the at least one signal generating unit, more preferably a side wall of the housing of the at least one signal generating unit.

In this context, it might be further advantageous if the signaling unit is attached to the at least one measurement antenna, especially the measurement antenna array, preferably a housing of the at least one measurement antenna, especially a housing of the measurement antenna array, more preferably a side wall of the housing of the at least one measurement antenna, especially a side wall of the housing of the measurement antenna array.

While various embodiments of the present invention have been described above, it should be understood that they have been presented by way of example only, and not limitation. Numerous changes to the disclosed embodiments can be made in accordance with the disclosure herein without departing from the spirit or scope of the invention. For example, a current may be measured instead of a voltage. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An over-the-air test system comprising:
   a test chamber,
   a device under test,
   measurement equipment for performing at least one wireless measurement with respect to the device under test, and
   a signaling unit,
   wherein the signaling unit is configured to visually and/or acoustically indicate a status of the at least one wireless measurement,
   wherein the test chamber comprises a window,
   wherein the signaling unit is located in the test chamber for an indirect lighting within the test chamber with the aid of the signaling unit,
   wherein the signaling unit is attached to the measurement equipment,
   wherein the signaling unit is configured to display a color for the purpose of measuring low power without an attenuator, and
   wherein the measurement equipment comprises a plane wave converter.

2. The over-the-air test system according to claim 1, wherein the device under test comprises at least one antenna under test.

3. The over-the-air test system according to claim 1, wherein the measurement equipment comprises at least one signal generating unit.

4. The over-the-air test system according to claim 3, wherein the at least one signal generating unit comprises at least one measurement antenna.

5. The over-the-air test system according to claim 1,
wherein the signaling unit is further configured to indicate the status of the at least one measurement in an audio and/or visual manner.

6. The over-the-air test system according to claim 1,
wherein the signaling unit is further configured to display different sensitivity ranges with respect to the at least one wireless measurement.

7. The over-the-air test system according to claim 1,
wherein the signaling unit is further configured to display a color for the purpose of signaling that the measurement is running.

8. The over-the-air test system according to claim 1,
wherein the signaling unit is further configured to display a color for the purpose of measuring high power with at least one attenuator.

9. The over-the-air test system according to claim 1,
wherein the signaling unit is further configured to display a color for the purpose of measuring with at least one amplifier.

10. The over-the-air test system according to claim 1,
wherein the test chamber is an anechoic chamber.

11. The over-the-air test system according to claim 1,
wherein the signaling unit comprises a light bulb with different colors, or
wherein the signaling unit comprises a LED light strip with different colors.

12. The over-the-air test system according to claim 1,
wherein the measurement equipment comprises at least one of an oscilloscope, a network analyzer, a receiver, a scanner, a spectrum analyzer, or any combination thereof.

13. The over-the-air test system according to claim 3,
wherein the signaling unit is attached to the at least one signal generating unit.

14. The over-the-air test system according to claim 4,
wherein the signaling unit is attached to the at least one measurement antenna.

15. An over-the-air test method comprising the steps of:
performing at least one wireless measurement with respect to a device under test with the aid of measurement equipment within a test chamber,
visually and/or acoustically indicating a status of the at least one wireless measurement with the aid of a signaling unit, and
attaching the signaling unit to the measurement equipment,
wherein the test chamber comprises a window,
wherein the signaling unit is located in the test chamber for an indirect lighting within the test chamber with the aid of the signaling unit,
wherein the signaling unit is configured to display a color for the purpose of measuring low power without an attenuator, and
wherein the measurement equipment comprises a plane wave converter.

* * * * *